US008270558B2

(12) United States Patent
Dielissen

(10) Patent No.: US 8,270,558 B2
(45) Date of Patent: Sep. 18, 2012

(54) ELECTRONIC DEVICE, BARREL SHIFTER UNIT AND METHOD OF BARREL SHIFTING

(75) Inventor: John Dielissen, Nederweert (NL)

(73) Assignee: ST-Ericsson SA, Geneva (CH)

( * ) Notice: Subject to any disclaimer, the term of this patent is extended or adjusted under 35 U.S.C. 154(b) by 156 days.

(21) Appl. No.: 12/733,600

(22) PCT Filed: Sep. 9, 2008

(86) PCT No.: PCT/IB2008/053627
§ 371 (c)(1),
(2), (4) Date: Jul. 6, 2010

(87) PCT Pub. No.: WO2009/034517
PCT Pub. Date: Mar. 19, 2009

(65) Prior Publication Data
US 2010/0272227 A1    Oct. 28, 2010

(30) Foreign Application Priority Data

Sep. 10, 2007 (EP) .................................... 07115984

(51) Int. Cl.
*G11C 19/00* (2006.01)
(52) U.S. Cl. .......................................... 377/69; 708/209
(58) Field of Classification Search .................. 377/69; 708/209
See application file for complete search history.

(56) References Cited

U.S. PATENT DOCUMENTS

| 5,254,979 | A | * | 10/1993 | Trevett et al. ................. 345/639 |
| 5,485,490 | A | * | 1/1996 | Leung et al. ................. 375/371 |
| 5,682,467 | A | * | 10/1997 | Ambalavanar ............... 358/1.15 |
| 5,710,873 | A | * | 1/1998 | Romano et al. .............. 358/1.16 |
| 5,781,457 | A | | 7/1998 | Cohen et al. |
| 6,304,956 | B1 | | 10/2001 | Tran |
| 6,766,411 | B2 | * | 7/2004 | Goldshlag .................... 711/109 |
| 7,047,269 | B2 | * | 5/2006 | Wu et al. ...................... 708/440 |
| 7,126,429 | B2 | * | 10/2006 | Mitric ............................. 331/2 |
| 7,752,249 | B2 | * | 7/2010 | Yu ................................. 708/404 |
| 2006/0036933 | A1 | | 2/2006 | Blankenship et al. |
| 2006/0085720 | A1 | * | 4/2006 | Tran et al. ..................... 714/758 |
| 2010/0293212 | A1 | * | 11/2010 | Paumier et al. ............... 708/209 |
| 2011/0191650 | A1 | * | 8/2011 | Yokokawa .................... 714/752 |

OTHER PUBLICATIONS

International Search Report dated Sep. 2, 2009 in connection with PCT Patent Application No. PCT/IB2008/053627.
Written Opinion of the International Searching Authority dated Sep. 2, 2009 in connection with PCT Patent Application No. PCT/IB2008/053627.

* cited by examiner

*Primary Examiner* — Lincoln Donovan
*Assistant Examiner* — William Hernandez

(57) ABSTRACT

An electronic device is provided which comprises a barrel shifter unit (BS) for performing a rotation of an input. The barrel shifter unit comprises a first and second barrel shifter (BS1, BS2). The electronic device furthermore comprises a selection unit for selecting a first set of elements (a) for the second barrel shifter (BS2) and a second set of elements for the first barrel shifter (BS1). The electronic device furthermore comprises a plurality of second multiplexers (M1 M8) for receiving the input of the second barrel shifter as first input and the output of the first barrel shifter as second input.

20 Claims, 4 Drawing Sheets

ELECTRONIC DEVICE, BARREL SHIFTER UNIT AND METHOD OF BARREL SHIFTING

CROSS-REFERENCE TO RELATED APPLICATION(S)

The present application claims priority under 35 U.S.C. §365 to International Patent Application No. PCT/IB2008/053627 filed Sep. 9, 2008, entitled "ELECTRONIC DEVICE, BARREL SHIFTER UNIT AND METHOD OF BARREL SHIFTING". International Patent Application No. PCT/IB2008/053627 claims priority under 35 U.S.C. §365 and/or 35 U.S.C. §119(a) to European Patent Application No. 07115984.2 filed Sep. 10, 2007 and which are incorporated herein by reference into the present disclosure as if fully set forth herein.

FIELD OF THE INVENTION

The present invention relates to an electronic device, a barrel shifter unit and a method of barrel shifting.

BACKGROUND OF THE INVENTION

In the digital video broadcast via satellite standard DVB-S2, a low-density parity-check LDPC algorithm is used for error correction, i.e. to transmit a message over a noisy transmission channel. The LDPC is a code allowing a data transmission rate closed to the theoretical maximum. The LDPC codes are defined as a sparse parity-check matrix which can be randomly generated. The LDPC decoding can be implemented in the standards IEEE 802.11n and IEEE 802.16e. In "Low cost LDPC decoder for DVB-S2", DATE Designers Forum 2006, pages 130-135, a LDPC decoder based on barrel shifters has been described.

FIG. 1 shows a basic diagram of an architecture of a LDPC decoder according to the prior art. Here, an IO controller IOC, an address generator AG, a barrel shifter BS, a first memory unit M1, a second memory unit M2 and several data paths DP0, DP1, DPD1 are depicted. D data words $\alpha_n$ are packed into one word in the $\alpha$ memory M1. These $\alpha_n$ words are rotated over a certain angle by means of the barrel shifters BS and passed on to the D data paths. After Km clock cycles, the $\alpha_n$ words are returned and are rotated back over the same angle.

Accordingly, a barrel shifter is used to shift a data word by a specific number of positions. It can for example be implemented as a sequence of multiplexers. The output of one multiplexer is connected to the input of the next multiplexer depending on the shift distance. The number of multiplexers required is $n*\log_2(n)$ with n bit words. In a four bit barrel shifter with inputs A, B, C and D, the barrel shifter can cycle the order of the bits A, B, C, D, i.e. the shifter can shift all the outputs up to three positions to the right. Typically, a barrel shifter is implemented as a cascade of parallel 2×1 multiplexers. In case of a four bit barrel shifter, an intermediate signal is used to shift by two bits or passes the same data.

In "A new design for a fast barrel switch network", by Tharakan et al. in IEEE Journal of Solid-state circuits, volume 27, no. 2, February 1992, a barrel shifter is described.

FIG. 2 shows a schematic block diagram of a barrel shifter according to the prior art. The barrel shifter comprises several layers each comprising a plurality of multiplexers. Each multiplexer has two inputs and an output. The first layer L1 of the barrel shifter rotates the input vector over [0,1], the second layer L2 rotates the input vector over [0,2], the third layer rotates the input vector over [0,4]. By combining the layers, any desired shift angle can be achieved. The barrel shifter according to FIG. 2 should however not only able to rotate the input vector over the parallelism factor n but also over smaller instances. Here, a barrel shifter of n=8 is depicted.

FIG. 3 shows a schematic block diagram of a barrel shifter according to the prior art. In FIG. 3, a barrel shifter with n=6 is depicted.

FIG. 4 shows a schematic block diagram of a further barrel shifter according to the prior art. In particular, the barrel shifter according to FIG. 4 is a combination of the barrel shifters of FIG. 2 and FIG. 3. The barrel shifter according to FIG. 4 furthermore constitutes a configurable barrel shifter. However, the multiplexing tree increases with x−1, wherein x being the number of tap points. The number of multiplexing trees is the number of the vertical wires which is P−1 for $P=2^a$, wherein a>1. For the case that P is not a power of two, the next power of two must be used. The complexity of this network is thus $\geq P*x$.

The current bit of the last multiplexer in the layer L1 is forwarded to the first input of the first multiplexer in the first layer L1. At the last multiplexer in the second layer L2, the output of the last multiplexer in the first layer is inputted as the second input. The first input of the multiplexer of the last multiplexer of the second layer corresponds to the output of the second but last multiplexer in the first layer. The last multiplexer in the third layer L3 receives at its second input the output of the last multiplexer in the second layer L2 and at its first input is the output of the fourth multiplexer of the second layer L2.

In FIG. 4, the barrel shifter can be operated either at n=6 or at n=8. Accordingly, at the output of each layer, a multiplexer MUXL1, MUXL2, MUXL3, respectively is arranged and receives the sixth input bit and the eighth input bit.

For an IEEE 802.16e architecture, the parameters of such a barrel shifter are n=96 and x=19. Accordingly, the barrel shifter has a complexity of 7*96=673. If such a barrel shifter has to be made configurable, then the complexity is 18*673=1728 increasing the complexity by 250%. Furthermore, if the barrel shifter is to be made fully configurable, the complexity will raise from $n*\log(n)$ to $n^2+n\log(n)$. A logic depth of the barrel shifters according to the state of the art corresponds to the traditional log(n) and the additional selection tree of log(x). If x=n, this factor is 2.

SUMMARY OF THE INVENTION

It is therefore an object of the invention to provide an electronic device with a barrel shifter unit which has a reduced complexity while still being configurable.

This object is solved by an electronic device according to claim 1, a barrel shifter unit according to claim 8 and a method of barrel shifting according to claim 10.

Accordingly, an electronic device is provided which comprises a barrel shifter unit for performing a rotation of an input. The barrel shifter unit comprises a first and second barrel shifter. The electronic device furthermore comprises a selection unit for selecting a first set of elements for the second barrel shifter and a second set of elements for the first barrel shifter. The electronic device furthermore comprises a plurality of second multiplexers for receiving the input of the second barrel shifter as first input and the output of the first barrel shifter as second input.

According to an aspect of the invention, the first and second barrel shifters are implemented as nlog (n) barrel shifters. Therefore, a fully configurable barrel shifter can be achieved based on two nlog (n) barrel shifters (in parallel).

According to a further aspect of the invention, the first and second barrel shifters are implemented in parallel, such that the barrel shifter unit can be clocked every clock cycle.

According to a further aspect of the invention, the first and second barrel shifters are implemented in a series arrangement. The output of the first or second barrel shifter are stored while the second or first barrel shifter is performing its barrel shifting operation.

According to a further aspect of the invention, the first and second barrel shifter each comprise a plurality of layers, wherein each layer comprises a plurality of first multiplexers, wherein the output of the first multiplexers in the last layer of the second barrel shifter are used as first input in the plurality of second multiplexers, and wherein the output of the first multiplexers in the last layer of the first barrel shifters are used as second input in the plurality of second multiplexers.

The invention also relates to a barrel shifter unit with a first and second barrel shifter. A first set of elements is supplied to the second barrel shifter and a second set of elements is supplied to the first barrel shifter. Furthermore, a plurality of second multiplexers is provided which receive the output of the second barrel shifter as first input and the output of the first barrel shifter as second inputs.

The invention also relates to a method of barrel shifting. Here, a first and second barrel shifter for performing a rotation of an input is provided. A first set of elements is selected for the second barrel shifter and a second set of elements is selected for the first barrel shifter. Furthermore, a plurality of second multiplexers is provided which receive the output of the second barrel shifter as first inputs and the output of the first barrel shifter as second inputs.

The invention relates to the idea to use two nlog (n) barrel shifters. One of the two barrel shifters is used to rotate the first z–a elements, wherein "z" is the configured size of the barrel shifter and "a" is the angle of the rotation. The other one of the two barrel shifters is used to rotate the other "a" elements. In order to perform these diverse rotations, a selection unit selects the first "a" elements from the second barrel shifter and the remaining "z–a" elements from the first barrel shifter. The second barrel shifter can rotate the input vector over an angle of $(a+(n-z))\% \, n$. With the two barrel shifters, an area complexity of $2n\log(n)+n$ is achieved which can be smaller $n\log(n)+n*x$ if $x>\log(n)+1$.

Furthermore, the logic depth can be reduced as it is increased to $\log(n)+1$ instead of $\log(n)+\log(x)$.

Further aspects of the invention are defined in the dependent claims.

BRIEF DESCRIPTION OF THE DRAWINGS

Advantages and embodiments of the invention will now be described in more detail with reference to the figures.

DETAILED DESCRIPTION OF EMBODIMENTS

In the following, embodiments of a barrel shifter will be described in more detail. A barrel shifter is a hardware device that is able to shift or rotate e.g. a data word by any number of bits in a single operation. This can for example be implemented as a multiplexer wherein each output can be connected to any input depending on the shift distance. Accordingly, a barrel shifter can be used to perform any data shifting. The barrel shifter is used to shift data by incremental stages avoiding extra clocks to the registers and reducing the time spent on shifting or rotating the data.

Figure 1:
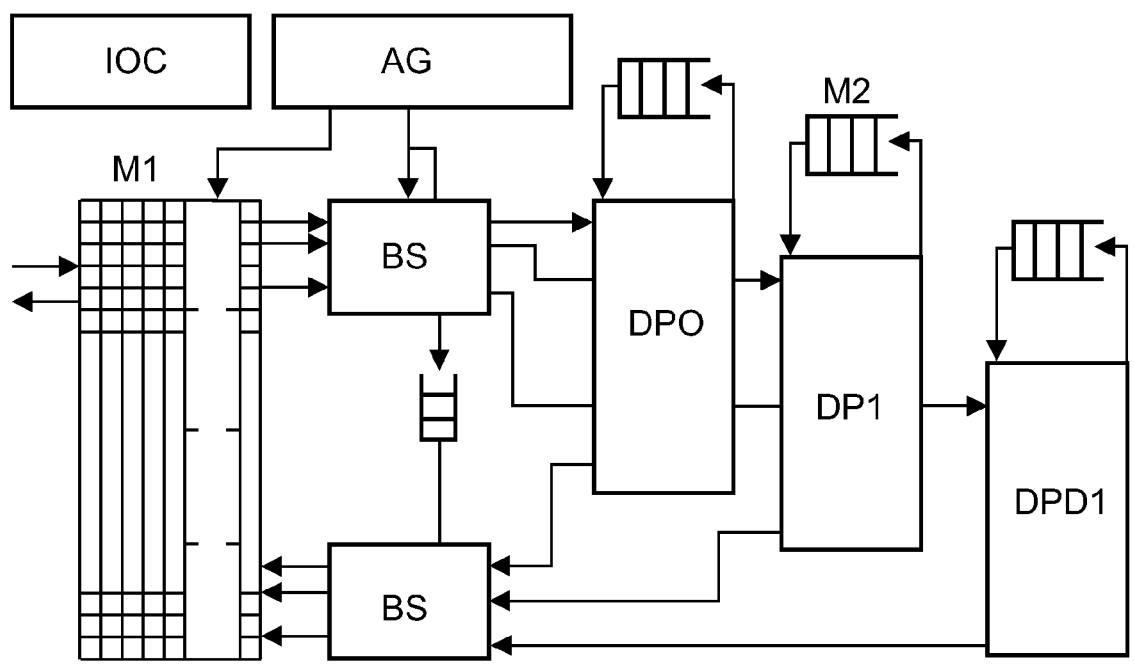
FIG. 1 shows a basic architecture of a LDPC decoder according to the prior art.
Figure 2:
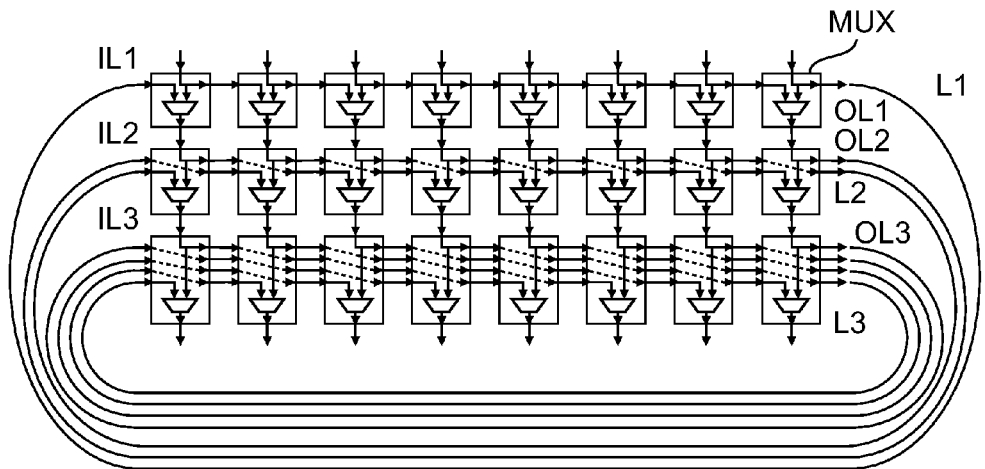
FIG. 2 shows a schematic block diagram of a barrel shifter according to the prior art.
Figure 3:
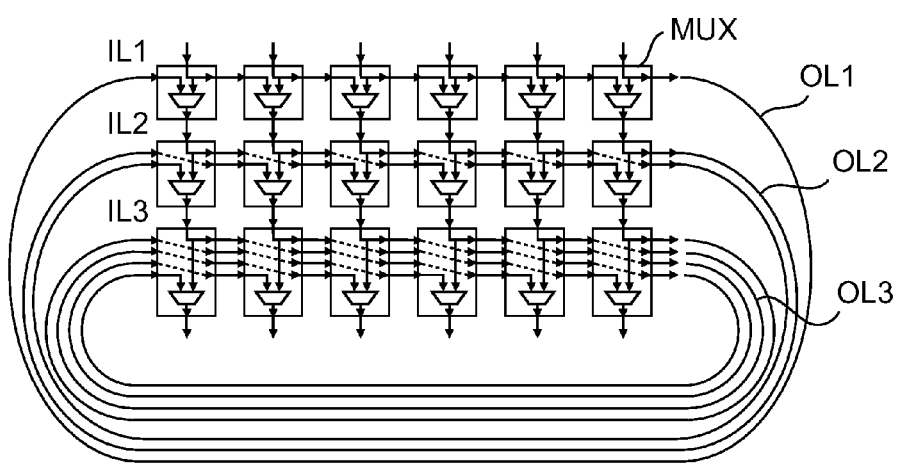
FIG. 3 shows a schematic diagram of a barrel shifter according to the prior art.
Figure 4:
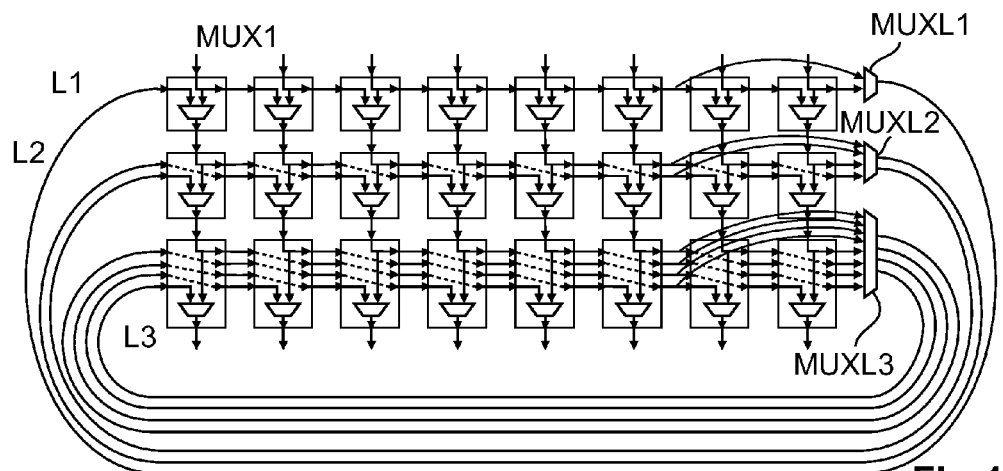
FIG. 4 shows a schematic diagram of a barrel shifter according to the prior art.

Such a barrel shifter can be used in a LDPC decoder as depicted for example in FIG. 1, e.g. in a DVB-S receiver.

Figure 5:
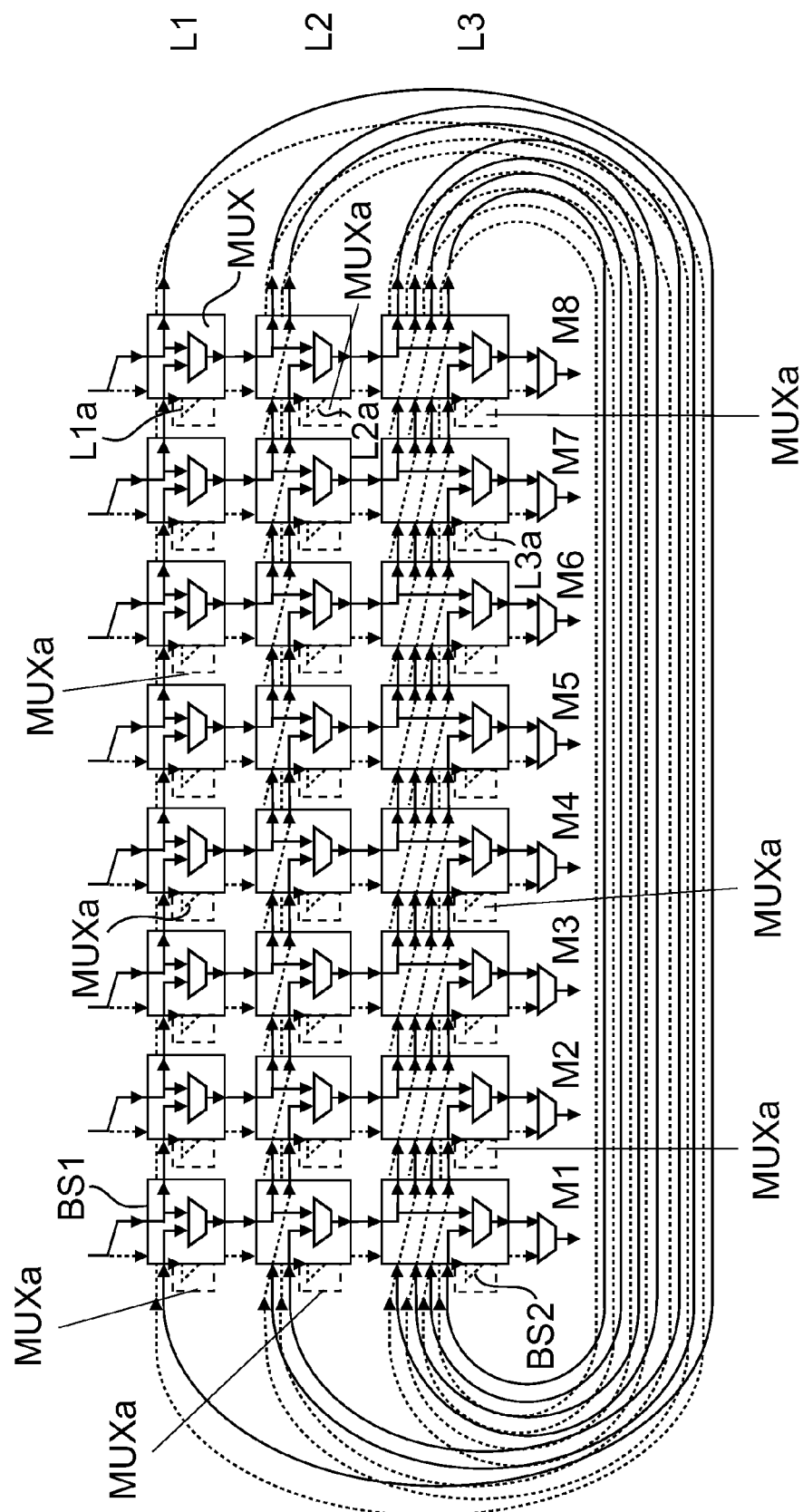
FIG. 5 shows a schematic diagram of a barrel shifter according to a first embodiment.

FIG. 5 shows a schematic block diagram of a barrel shifter according to a first embodiment. The barrel shifter unit comprises a first and a second barrel shifter. Each of the two barrel shifters has a complexity of $n\log(n)+n$. Each barrel shifters comprises several layers L1, L2, L3; L1$a$, L2$a$, L3$a$, wherein each layer is composed of a plurality of multiplexers MUX; MUXa. Preferably, each multiplexer has two inputs and an output. Each multiplexer has two inputs and an output. The first input of the multiplexer receives a previous bit and the second input receives a current bit.

In FIG. 5, the barrel shifter unit comprises a first barrel shifter BS1 and a second barrel shifter BS2, wherein the second barrel shifter BS2 is arranged in parallel to the first barrel shifter BS1. The first barrel shifter BS1 comprises three layers L1-L3 of multiplexers MUX while the second barrel shifter BS2 comprises three layers L1$a$, L2$a$, L3$a$, wherein each layer comprises a plurality of multiplexers MUXa. The first and second barrel shifter BS1, BS2 and in particular the multiplexers of the first layer L1; L1$a$ receive the identical data at their respective second inputs. Their respective first input receives the data from the proceeding multiplexer, respectively.

The barrel shifter unit furthermore comprises eight multiplexers M1-M8 which receive at their first inputs the outputs of the multiplexers of the third layer of the second barrel shifter BS2 and at their second inputs the outputs of the multiplexers of the third layer of the first barrel shifter BS1.

The first and second barrel shifter BS1, BS2 are each implemented as nlog (n) barrel shifter. The first barrel shifter can be used to rotate the first "z–a" elements, wherein "z" corresponds to the configured size of the barrel shifter and "a" corresponds to the angle of the rotation. The second barrel shifter can be used to rotate the other remaining "a" elements. In other words, the "z–a" elements are provided to the second barrel shifter and the "a" elements are provided to the third barrel shifter. Therefore, the second barrel shifter can rotate the input vector or the input over an angle of $(a+(n-z))\% \, n$.

Figure 6:
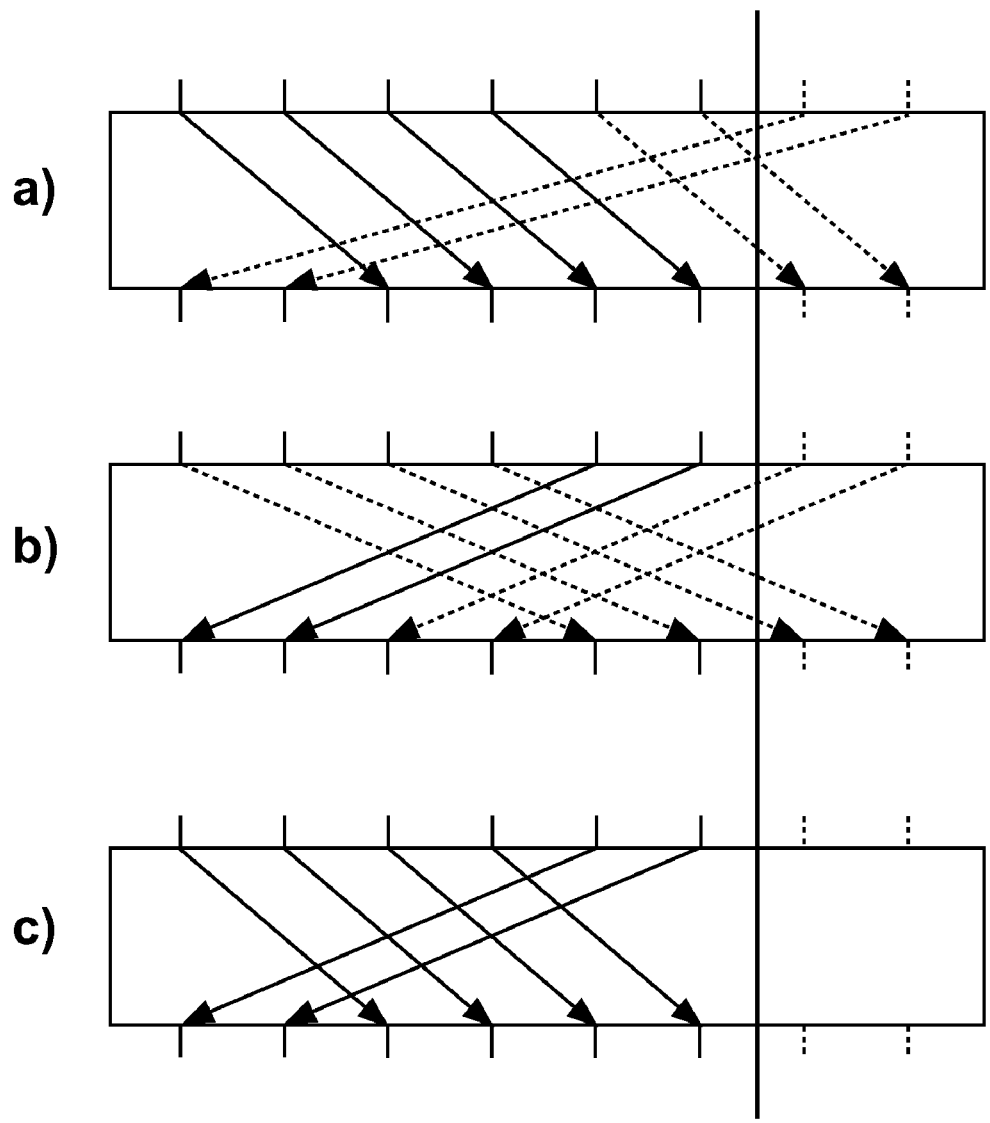
FIG. 6 shows a working example of the barrel shifter according to FIG. 5.

FIG. 6 shows a schematic representation of the functioning of the barrel shifter unit according to the first embodiment. In FIG. 6$a$, the first barrel shifter performs a rotation with $a=2$ in $n=8$. In FIG. 6$b$, the second barrel shifter performs a rotation over $a=2+(8-6)=4$ in $n=8$. In FIG. 6$c$, the results over the rotation over $a=2$ in $z=6$ is depicted.

According to the first embodiment, the barrel shifter unit comprises two barrel shifters which are each implemented as $n\log(n)$ barrel shifters. The outputs of the multiplexers in the last layer of the first and second barrel shifters are each inputted to a multiplexer. Accordingly, the first barrel shifter can be used to rotate the first "z–a" elements while the other barrel shifter can be used to rotate the other "a" elements. It should be noted that z corresponds to the configured size of the barrel shifter. The output multiplexer selects a first "a" elements from the second barrel shifter and the "z–a" remaining elements from the first barrel shifter.

The first and second barrel shifter may be implemented in parallel and depicted in FIG. 5. Alternatively, the two barrel shifters may be implemented in a series arrangement, wherein the output of the first or second barrel shifter is stored or buffered while the second or first barrel shifter is performing its operation. Thereafter, the output multiplexer may select a first "a" element from the second barrel shifter (or from the register where the results are stored) and the "z–a" remaining elements from the first barrel shifter (or from the register where the results of the barrel shifting have been stored). In the series arrangement of the first and second barrel shifter, a data word is rotated every two clock cycles. Here, the results of the first barrel shifting can be stored in a register in the multiplexer while the second barrel shifting is performed. Thereafter, a selection of the first or second barrel shifting is performed. However, it should be noted that according to this embodiment, two clock cycles are required, namely one for the first barrel shifting and a second clock cycle for the second barrel shifting.

With the barrel shifter unit according to the first embodiment, an area complexity of $2n\log(n)+n$ can be achieved which is smaller than the area complexity of $n\log(n)+n*x$ for $x>\log(n)+1$.

For an implementation of the barrel shifter according to the first embodiment, in an IEEE 802.16e implementation, the total overhead will reach 115% while the overhead of the prior art implementation is 250%. If the barrel shifter is implemented on or by a 90 mm technology, the barrel shifter implementation will have an area of 0.2 mm$^2$ instead of an area of 0.4 mm$^2$. A multi-standard LDPC decoder with the same parameters as in a prior art solution will have a synthesis area of more than 0.7 mm$^2$.

The barrel shifter according to the present invention comprises a parallel configuration of a first and second barrel shifter. The inputs of the first and second barrel shifter are coupled together and the outputs are coupled to an additional layer of multiplexers, namely output multiplexers. The $k^{th}$ output multiplexer selects the output signal from the $k^{th}$ outputs of the first and second barrel shifter. The first barrel shifter rotates the input vector over a number of "a" bits and the second barrel shifter rotates the input vector over a number of "a'" bits, wherein "a'"=a+(n–z)mod n. The first "a" output multiplexers select their outputs from the second barrel shifter and the next (z–a) multiplexers select their output from the first barrel shifter.

The barrel shifter according to the embodiments of this invention can be used in a LDPC decoder, for example in the IEEE 802.16e standard.

The barrel shifter according to the present invention can be used in any floating-point arithmetic hardware.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

Furthermore, any reference signs in the claims shall not be constrained as limiting the scope of the claims.

The invention claimed is:

1. An electronic device comprising:
a barrel shifter unit configured to perform a rotation of an input vector, the barrel shifter unit comprising:
first and second barrel shifters that are implemented as nlog barrel shifters;
a selection unit configured to select a first set of elements for the second barrel shifter and a second set of elements for the first barrel shifter; and
a plurality of second multiplexers configured to receive second barrel shifter outputs of the second barrel shifter as first inputs and first barrel shifter outputs of the first barrel shifter as second inputs.

2. The electronic device according to claim 1, wherein the first and second barrel shifters are implemented in parallel.

3. The electronic device according to claim 1, wherein first and second barrel shifters are implemented in a series arrangement,
wherein at least one of:
the first barrel shifter outputs shifter is are configured to be stored while the second barrel shifter is performing a second barrel shifting operation; and
the second barrel shifter outputs shifter is are configured to be stored while the first barrel shifter is performing a first barrel shifting operation.

4. The electronic device according to claim 3, wherein the first and second barrel shifters are clocked every second clock cycle, respectively such that the barrel shifter unit is clocked every second clock cycle.

5. The electronic device according to claim 1, wherein the first and second barrel shifters each comprise a plurality of layers, wherein each layer comprises a plurality of first multiplexers.

6. The electronic device according to claim 1, wherein the barrel shifter unit is configured to rotate the input vector over a programmable value.

7. A barrel shifter unit, comprising:
a first and second barrel shifters that are implemented as nlog barrel shifters, each of the first and second barrel shifters configured to rotate an input vector by a number of positions,
wherein a first set of elements of the input vector is supplied to the second barrel shifter and a second set of elements of the input vector is supplied to the first barrel shifter, and
a plurality of second multiplexers configured to receive second barrel shifter outputs as first inputs and first barrel shifter outputs as second inputs.

8. The barrel shifter unit according to claim 7, wherein the first and second barrel shifters are implemented in parallel.

9. The barrel shifter unit according to claim 7, wherein the first and second barrel shifters are implemented in a series arrangement.

10. The barrel shifter unit according to claim 9, wherein the first barrel shifter is configured to store the first barrel shifter outputs while the second barrel shifter is performing the barrel shifting, and the second barrel shifter is configured to store the second barrel shifter outputs while the first barrel shifter is performing the barrel shifting.

11. A digital video broadcast receiver, comprising:
a low-density parity-check decoder unit comprising a barrel shifter unit, the barrel shifter unit comprising:
first and second barrel shifters that are implemented as nlog barrel shifters;
a selection unit configured to select a first set of elements for the second barrel shifter and a second set of elements for the first barrel shifter; and a plurality of second multiplexers configured to receive second barrel shifter outputs of as first inputs and first barrel shifter outputs as second inputs.

12. The digital video broadcast receiver according to claim 11, wherein the first and second barrel shifters are implemented in at least one of a parallel arrangement and a series arrangement.

13. The digital video broadcast receiver according to claim 11, wherein the first and second barrel shifters each comprises a plurality of layers, wherein each layer comprises a plurality of first multiplexers.

14. A method for barrel shifting, comprising:
providing first and second barrel shifters that are implemented as nlog barrel shifters each barrel shifter configured to perform a rotation of an input vector,
selecting a first set of elements for the second barrel shifter and a second set of elements for the first barrel shifter,
providing a plurality of second multiplexers which receive second barrel shifter outputs as first inputs and first barrel shifter outputs as second inputs.

15. The method according to claim 14, wherein the first and second barrel shifters are implemented in parallel.

16. The method according to claim 14, wherein the first and second barrel shifters are implemented in a series arrangement, the method further comprising:
performing barrel shifting by each of the first and second barrel shifters.

17. The method according to claim 16, wherein performing the barrel shifting further comprises at least one of:
storing the first barrel shifter outputs while the second barrel shifter is performing the barrel shifting; and
storing the second barrel shifter outputs while the first barrel shifter is performing the barrel shifting.

18. The method according to claim 17, further comprising clocking the first and second barrel shifters every second clock cycle, respectively such that each barrel shifter unit is clocked every second clock cycle.

19. The method according to claim 14, wherein the first and second barrel shifters each comprises a plurality of layers, wherein each layer comprises a plurality of first multiplexers.

20. The method according to claim 14, further comprising rotating, by the barrel shifter unit, the input vector over a programmable value.

* * * * *